(12) United States Patent
Frey

(10) Patent No.: US 7,301,800 B2
(45) Date of Patent: Nov. 27, 2007

(54) MULTI-BIT MAGNETIC RANDOM ACCESS MEMORY ELEMENT

(75) Inventor: Christophe Frey, Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 81 days.

(21) Appl. No.: 10/881,746

(22) Filed: Jun. 30, 2004

(65) Prior Publication Data

US 2006/0002182 A1    Jan. 5, 2006

(51) Int. Cl.
*G11C 11/00* (2006.01)
(52) U.S. Cl. .................. 365/158; 365/171; 365/173
(58) Field of Classification Search ............... 365/158, 365/171, 173
See application file for complete search history.

(56) References Cited

U.S. PATENT DOCUMENTS

| | | | |
|---|---|---|---|
| 5,029,141 A | 7/1991 | Yoshimoto et al. | |
| 5,274,597 A | 12/1993 | Ohbayashi et al. | |
| 5,287,304 A | 2/1994 | Harward et al. | |
| 5,748,545 A | 5/1998 | Lee et al. | |
| 6,331,943 B1* | 12/2001 | Naji et al. | 365/158 |
| 6,335,890 B1 | 1/2002 | Reohr et al. | |
| 6,532,163 B2 | 3/2003 | Okazawa | |
| 6,594,191 B2 | 7/2003 | Lammers et al. | |
| 6,639,834 B2 | 10/2003 | Sunaga et al. | |
| 6,717,844 B1 | 4/2004 | Ohtani | |
| 6,778,429 B1 | 8/2004 | Lu et al. | |
| 6,778,434 B2 | 8/2004 | Tsuji | |
| 6,795,335 B2* | 9/2004 | Hidaka | 365/158 |
| 6,829,162 B2* | 12/2004 | Hosotani | 365/158 |
| 6,862,235 B2 | 3/2005 | Sakata et al. | |
| 6,891,742 B2 | 5/2005 | Takano et al. | |
| 6,894,918 B2 | 5/2005 | Sharma et al. | |
| 6,940,749 B2 | 9/2005 | Tsang | |
| 2002/0027803 A1 | 3/2002 | Matsui | |
| 2002/0034117 A1* | 3/2002 | Okazawa | 365/230.03 |
| 2002/0064067 A1 | 5/2002 | Inui | |

(Continued)

FOREIGN PATENT DOCUMENTS

EP    1 320 104    6/2003

(Continued)

OTHER PUBLICATIONS

Nahas, "A 4Mb 0. μm 1T1MTJ Toggle MRAM Memory," 2004 IEEE International Solid-State Circuits Conference, ISSCC 2004, Session 2, Non-Volatile Memory/2.3, 0-7803-8267-6, 2004.

(Continued)

*Primary Examiner*—Huan Hoang
(74) *Attorney, Agent, or Firm*—Lisa K. Jorgenson; Andre M. Szuwalski

(57) ABSTRACT

A magnetic random access memory element is made from a first magnetic tunnel junction and a second magnetic tunnel junction. These magnetic tunnel junctions are connected to each other in a series resistive circuit. The connected first and second magnetic tunnel junctions are connected to a bit line through an access transistor. A write bit line and a write data line are associated with each of the first and second magnetic tunnel junctions. By application of appropriate currents to these lines, the magnetic vector orientation with each of the first and second magnetic tunnel junctions can be controlled so as to store information within the element in any one of at least three logic states.

16 Claims, 2 Drawing Sheets

U.S. PATENT DOCUMENTS

| | | |
|---|---|---|
| 2002/0080644 A1 | 6/2002 | Ito |
| 2002/0176272 A1 | 11/2002 | DeBrosse et al. |
| 2003/0026125 A1 | 2/2003 | Hidaka |
| 2003/0058686 A1 | 3/2003 | Ooishi et al. |
| 2004/0047204 A1* | 3/2004 | Hung et al. .................. 365/202 |
| 2004/0052105 A1 | 3/2004 | Fulkerson et al. |
| 2004/0125643 A1 | 7/2004 | Kang et al. |
| 2004/0165424 A1 | 8/2004 | Tsang |
| 2004/0208052 A1 | 10/2004 | Hidaka |
| 2005/0180203 A1 | 8/2005 | Lin et al. |
| 2005/0281080 A1 | 12/2005 | Dray et al. |
| 2005/0281090 A1 | 12/2005 | Dray et al. |

FOREIGN PATENT DOCUMENTS

| | | |
|---|---|---|
| EP | 1 607 979 | 12/2005 |

OTHER PUBLICATIONS

Patent Abstracts of Japan, vol. 2000, No. 03, and JP 11 354728, Canon, Inc.

European Search Report, EP 05 25 4099, dated Mar. 3, 2006.

* cited by examiner

MULTI-BIT MAGNETIC RANDOM ACCESS MEMORY ELEMENT

BACKGROUND OF THE INVENTION

1. Technical Field of the Invention

The present invention relates to magnetic random access memories and more particularly to a magnetic random access memory element.

2. Description of Related Art

A magnetic random access memory (MRAM) element typically has a structure that includes a first and second magnetic layers which are separated by a non-magnetic layer. A magnetic vector in one of the two magnetic layers is magnetically fixed or pinned, while the magnetic vector of the other of the two magnetic layers is not fixed and thus its magnetization direction is free to be controlled and switch. Information is written to and read from the element as a logic "1" or a logic "0" (i.e., one or the other of two possible logic states) by changing the direction of the non-fixed magnetization vector in the other of the two magnetic layers. The differences in magnetization vector direction cause resistance variations within the element which can be measured. For example, the shifting of the magnetization vector direction can represent two different resistances or potentials, which are then read by the memory circuit as either a logic "1" or a logic "0." The detection of these resistance or potential differences due to shifting magnetization vector direction allows information to be written to and read from the MRAM element.

Reference is now made to FIG. 1 wherein there is shown a schematic diagram of a conventional MRAM element 10. The element includes a bit line 12 and a word line 14. The memory storing structure of the element 10 is referred to as a "magnetic tunnel junction" 16 (MTJ) which is represented in the schematic by a variable resistance and is physically composed of the first and second magnetic layers and the separating non-magnetic layer discussed above. One end of this resistance is connected to the bit line 12. The other end of the resistance is connected to a conduction terminal of an access transistor 18. The access transistor 18 in the illustrated element 10 is an n-channel FET with its source conduction terminal connected to ground and its drain conduction terminal connected to the other end of the resistance. The gate terminal of the access transistor 18 is connected to the word line 14.

A write digit line 20 (WDL) and a write bit line 22 (WBL) for the element 10 intersect at the magnetic tunnel junction 14. These lines 20 and 22 selectively carry currents and thus each selectively create a magnetic flux proximate to the magnetic tunnel junction 16. The magnetic fields induced by current flow in the lines 20 and 22 can be used to set the non-fixed direction of the magnetic vector within the magnetic tunnel junction 16. As discussed above, the setting of this direction affects the resistance of the magnetic tunnel junction 16. By selectively choosing to apply current flow in the lines 20 and 22 of a certain magnitude, one can program the magnetic tunnel junction 16, through its varying resistance, to store either one of two logic states: a logic "1" or a logic "0."

In order to read the stored information from the element 10, the bit line 12 and word line 14 are selected. Selection of the word line 14 turns on the access transistor 18 and grounds the second end of the magnetic tunnel junction 16 resistance. A current, having a magnitude dependent on the programmed non-fixed direction of the magnetic vector within the magnetic tunnel junction, will accordingly flow from the bit line 12 through the resistance. A sense amplifier (not shown) which is connected to the bit line 12 can then measure current flowing in the bit line 12, as affected by the current flowing through the magnetic tunnel junction 16 variable resistance, and "read" the logic state of the element 10.

The conventional MRAM element 10 is capable of storing only two-bits per element (i.e., it can store only one of two possible logic states: either a logic "1" or a logic "0"). As memory storage needs increase, and the space available on integrated circuits for memory applications decreases, more attention is being directed to developing memory cells/elements that are more compact and also which are capable of storing more than two-bits per element (i.e., "multi-bit" memory elements capable of storing information in any one of three or more possible logic states). These needs extend to memories and circuits which include MRAM elements, and the present invention addresses the foregoing and other needs in the art.

SUMMARY OF THE INVENTION

An embodiment of the present invention comprises a multi-bit magnetic random access memory element capable of storing three (or more) bits of information per element.

In accordance with another aspect of the present invention, a magnetic random access memory element comprises a first and second magnetic tunnel junction. A write bit line and a write data line are associated with each of the first and second magnetic tunnel junctions. These lines are configured to control magnetic vector orientation within each of the first and second magnetic tunnel junctions so as to store information within the element in any one of at least three logic states.

In accordance with yet another embodiment of the invention, a magnetic random access memory element comprises a first magnetic tunnel and a second magnetic tunnel junction that are interconnected. An access transistor for the element connects one of the first or second magnetic tunnel junctions to a bit line.

In accordance with another embodiment of the present invention, a magnetic random access memory element is made from a first magnetic tunnel junction and a second magnetic tunnel junction. These magnetic tunnel junctions are connected to each other in a series resistive circuit. The connected first and second magnetic tunnel junctions are connected to a bit line through an access transistor. A write bit line and a write data line are associated with each of the first and second magnetic tunnel junctions. By application of appropriate currents to these lines, the magnetic vector orientation within each of the first and second magnetic tunnel junctions can be controlled so as to store information within the element in any one of at least three logic states.

Other aspects of the present invention include memory arrays made up of a plurality of memory elements according to any one of the embodiments described above. These memory arrays are implemented as integrated circuits fabricated on a semiconductor substrate.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
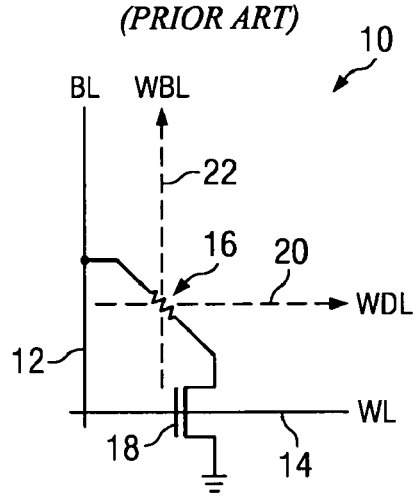
FIG. 1 is a schematic diagram of a prior art magnetic random access memory (MRAM) element.
Figure 2:
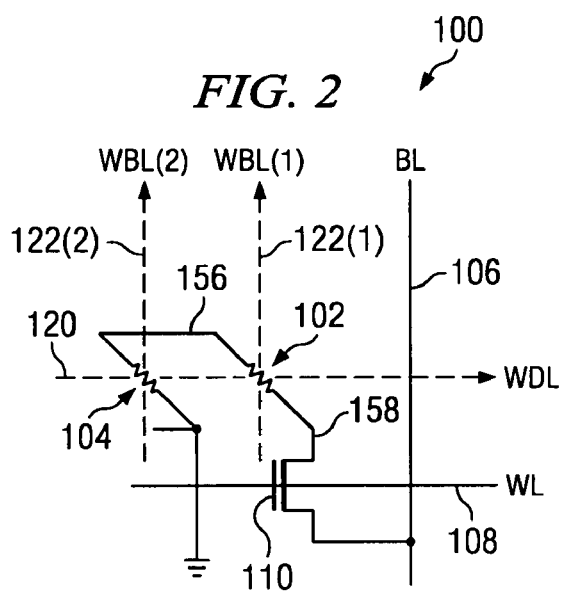
FIG. 2 is a schematic diagram of a magnetic random access memory element according to an embodiment of the present invention.

Reference is now made to FIG. 2 wherein there is shown a schematic diagram of a magnetic random access memory (MRAM) element 100 according to an embodiment of the present invention. Each element 100 includes first and second magnetic tunnel junctions 102 and 104 which are each represented in the schematic by a variable resistance and wherein each is physically composed of the first and second magnetic layers and the separating non-magnetic layer as discussed above. The two resistances associated with the magnetic tunnel junctions are connected (at reference 156) in series. More specifically, each of the resistances has a first and a second end. The series connection 156 of the two resistances connects the second end of the first magnetic tunnel junction 102 resistance to the second end of the second magnetic tunnel junction 104 resistance. A first end of the second magnetic tunnel junction 104 resistance is connected to a reference voltage (preferably, ground).

The MRAM element 100 includes a bit line 106 and a word line 108. A first end of the first magnetic tunnel junction 102 resistance is connected to a conduction terminal of an access transistor 110. The access transistor 110 in the illustrated element 100 is an n-channel FET with its source conduction terminal connected to the bit line 106 and its drain conduction terminal connected to the first end of the first magnetic tunnel junction 102 resistance. The gate terminal of the access transistor 110 is connected to the word line 108.

Figure 3:
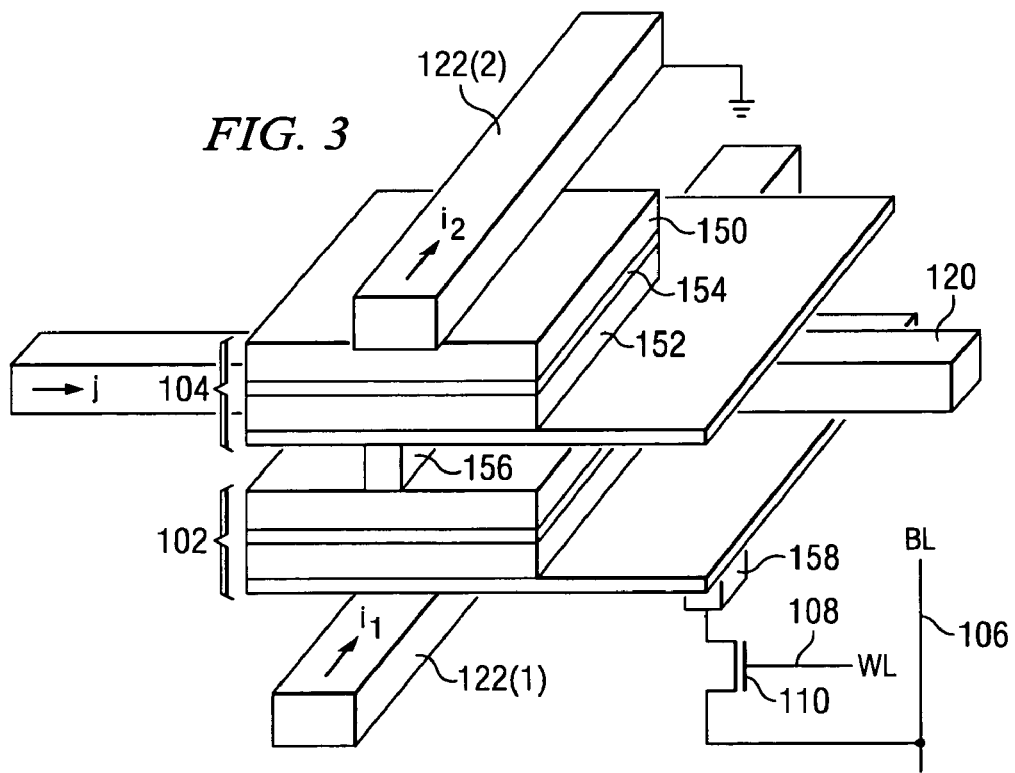
FIG. 3 is an illustration of the semiconductor device fabrication layer arrangement for implementing the MRAM element of FIG. 2.

A write digit line 120 (WDL) and a write bit line 122 (WBL) is provided for each of the two included magnetic tunnel junctions 102 and 104. In a preferred embodiment of the invention, the first and second magnetic tunnel junctions 102 and 104 actually share a single common write digit line 120. This shared configuration is possible where the two magnetic tunnel junctions are fabricated in a stacked relationship as illustrated in FIG. 3. In an alternative embodiment, the write digit lines 120 for the first and second magnetic tunnel junctions 102 and 104 are connected in series. This series configuration may be used where the two magnetic tunnel junctions are instead fabricated in a lateral side-by-side relationship. In either case, the write digit line(s) 120 provide(s) a common direction current flow (current j) with respect to the two magnetic tunnel junctions 102 and 104. The write bit line 122(1) for the first magnetic tunnel junction 102 and the write bit line 122(2) for the second magnetic tunnel junction 104 are separately implemented and carry separate currents (current i1 and current i2, respectively).

The write digit line 120 and the pair of write bit lines 122(1) and 122(2) for the element 100 intersect as illustrated at the first and second magnetic tunnel junctions 102 and 104. These lines 120, 122(1) and 122(2) selectively carry currents (j, i1 and i2) and thus each selectively create a magnetic flux proximate to the two magnetic tunnel junctions 102 and 104. The magnetic fields induced by current flow in the lines 120, 122(1) and 122(2) can be used to independently set the non-fixed direction of the magnetic vector within each of the magnetic tunnel junctions 102 and 104.

The setting of the resistances in the magnetic tunnel junctions (i.e., the writing of data to the element 100) is accomplished by applying the appropriate currents (j, i1 and i2) to the write digit line 120 and write bit lines 122(1) and 122(2). This operation is well understood by those skilled in the art. Differences in magnetization vector direction for each magnetic tunnel junction cause resistance variations. For example, the shifting of the magnetization vector direction can represent two different resistances or potentials for each magnetic tunnel junction resistance. These differences in resistance can be measured in order read any of one of a number of potential logic states from the memory element 100.

In order to read the stored information from the element 100, the bit line 106 and word line 108 are selected. Selection of the word line 108 turns on the access transistor 110 and connects the series connected resistances of the first and second magnetic tunnel junctions 102 and 104 to the bit line 106. A current, having a magnitude dependent on the programmed non-fixed direction of the magnetic vectors within each of the first and second magnetic tunnel junctions 102 and 104, will accordingly flow from the bit line 106 through the series resistances to ground. A sense amplifier (not shown) which is connected to the bit line 106 can then measure current flowing in the bit line 106, as affected by the current flowing through the two magnetic tunnel junctions 102 and 104 with variable resistances, and "read" the logic state of the element 100.

As discussed above, the setting of vector direction affects the resistance of the magnetic tunnel junction. By selectively applying current flow in the lines 120, 122(1) and 122(2) at certain magnitudes, one can independently program the non-fixed vector for each of the magnetic tunnel junctions 102 and 104. Thus, each of the first and second magnetic tunnel junctions 102 and 104 can be set to have at least a low and a high resistance. In this configuration, and given the series connection of the resistances, it is possible for the element 100 to be configured into one of four different logic states as follows:

state 1: $1^{st}$ MTJ low resistance (R(1)low) and $2^{nd}$ MTJ low resistance (R(2)low)

state 2: $1^{st}$ MTJ low resistance (R(1)low) and $2^{nd}$ MTJ high resistance (R(2)high)

state 3: $1^{st}$ MTJ high resistance (R(1)high) and $2^{nd}$ MTJ low resistance (R(2)low)

state 4: $1^{st}$ MTJ high resistance (R(1)high) and $2^{nd}$ MTJ high resistance (R(2)high).

In a conventional configuration and design, the two magnetic tunnel junctions will be identically constructed and have identical operating parameters. Thus, the low resistance values for the first and second magnetic tunnel junctions 102 and 104 will be the same (or nearly the same), and the high resistance values for the first and second magnetic tunnel junctions 102 and 104 will be the same (or nearly the same). The states 2 and 3 referenced above accordingly will not be distinguishable from each other by the connected sense amplifier (because Rlow+Rhigh=Rhigh+Rlow and thus the measured current in each instance will be the same). Thus, the element 100 is capable of storing three-bits of logic information (i.e., information in any one of three possible logic states: logic "00", "01"/"10" and "11"). However, where variation in high and low resistance values can be introduced with respect to the design and fabrication of each of the first and second magnetic tunnel junctions 102 and 104, the states 2 and 3 can be made distinct from each other (for example, when R(1)low≠R(2)low and/or R(1)high≠R(2)high). Thus, the element 100 would be capable of storing at least four bits of logical information (i.e., information in any one of four possible logic states: logic "00", "01", "10" and "11") for detection by the connected sense amplifier.

The MRAM element 100 of the present invention advantageously provides at least three-bits of data storage capacity (i.e., it can be configured into any one of at least three possible logic states). In an alternative configuration, the MRAM element 100 of the present invention advantageously provides at least four-bits of data storage capacity (i.e., it can be configured into any one of at least four possible logic states).

Although illustrated in a preferred embodiment as having two magnetic tunnel junction resistances connected in series, it will be recognized by one skilled in the art that more than two magnetic tunnel junction resistances could be connected in series, and further that plural magnetic tunnel junction resistances may be connected in parallel, series or combination serial/parallel configurations, as needed, without departing from the scope of the invention.

With reference now to FIG. 3, an exemplary semiconductor device fabrication layer arrangement for implementing the MRAM element of FIG. 2 is presented. In this arrangement, the first and second magnetic tunnel junctions 102 and 104 are stacked on top of each other in order to conserve space. Each magnetic tunnel junction includes a first and second magnetic layers 150 and 152 which are separated by a non-magnetic layer 154. This stacked configuration further allows for the two magnetic tunnel junctions 102 and 104 to share a common write digit line 120 which is positioned between the two stacked junctions and thus share a common programming current j. In this arrangement, the access transistor 110 may advantageously be fabricated below the stacked magnetic tunnel junctions, thus further saving space. Vias 156 and 158 are provided from the magnetic tunnel junction structure as needed for making the series connection between resistances and the drain connection to the access transistor, respectively. More specifically, the via 156 provides the series connection between the two magnetic tunnel junction resistances. The two write bit lines 122, carrying the programming currents i1 and i2, are fabricated above and below the stacked magnetic tunnel junction configuration and are independently controlled. The line 122(2) is grounded as shown.

Figure 4:
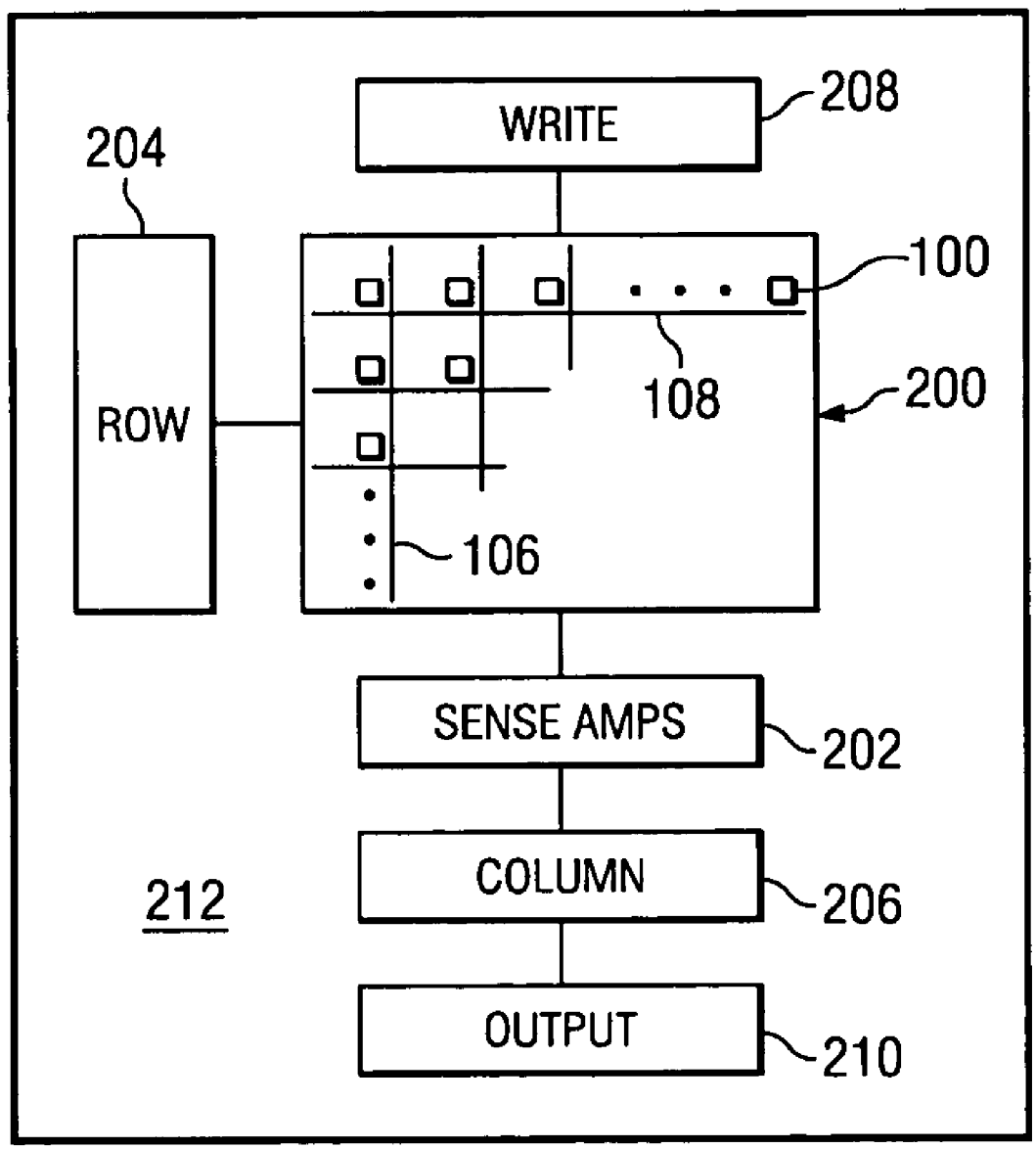
FIG. 4 is a block diagram of a memory array utilizing the MRAM elements of FIG. 2.

The schematic structure illustrated in FIG. 2 can be used as one element 100 (or cell) in a large memory array. This array, as shown in FIG. 4, contains N×M MRAM elements 100 in a memory block 200. A collection of sense amplifiers 202 are connected to the bit lines for purpose of reading certain ones of the elements 100 as are chosen by word line selection. Row and column decode circuitry 204 and 206 is used for making selection to groups of elements 100. Write control circuitry 208 (which includes input circuitry) is provided to apply the proper currents to the write bits lines and write data lines within the memory block 200 for purposes of writing logic data to selected elements 100. Output circuitry 210 is connected to the sense amplifiers 202 for outputting the read logic data from the elements 100. The entire memory circuit 212 is preferably integrated on a single semiconductor substrate. Alternatively, if desired, only certain portions of the memory circuit 212 may be integrated on a single semiconductor substrate.

The terms "connected" or "coupled" as used herein do not necessarily require a direct connection among and between the recited components. Rather, it will be appreciated by those skilled in the art that the Figures are illustrative and indirect connections or couplings through other components or devices or layers is possible without detracting from the operation of the invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A magnetic random access memory element, comprising:
   a magnetic random access memory element, comprising:
   a read bit line for the element;
   a first magnetic tunnel junction for the element;
   a second magnetic tunnel junction for the element; and
   a write bit line and a write data line associated with each of the first and second magnetic tunnel junctions and configured to control magnetic vector orientation with each of the first and second magnetic tunnel junctions so as to store information within the element at least three logic states; and
   a sense amplifier coupled to the read bit line, the sense amplifier sensing combined resistance of the first and second magnetic tunnel junctions of the element so as to detect which of the at least three logic states is stored by the element.

2. The memory of claim 1 wherein the write data lines comprise a common write data line shared by the series connected first and second magnetic tunnel junctions.

3. The memory of claim 1 wherein the write bit lines independently carry current past the first and second magnetic tunnel junctions.

4. The memory of claim 1 wherein the first and second magnetic tunnel junctions are connected together.

5. The memory of claim 4 wherein the first and second magnetic tunnel junctions are connected to each other in series.

6. The memory of claim 5 further comprising: an access transistor connected between a first end of the series connected first and second magnetic tunnel junctions and the read bit line.

7. The memory of claim 6 further comprising a word line connected to a gate terminal of the access transistor.

8. A memory device, comprising:
   a memory array including a plurality of memory elements, wherein each element is an individual magnetic random access memory MRAM cell which is selectively configured to store information in at least three possible logic states, and each cell comprises:
   a read bit line for the cell;
   interconnected first and second magnetic tunnel junctions; and
   a write bit line and a write data line associated with each of the first and second magnetic tunnel junctions and configured to control magnetic vector orientation within each of the first and second magnetic tunnel junctions so as to store information within the cell in at least three logic states; and
   a sense amplifier coupled to each of the read bit lines, each sense amplifier sensing combined resistence of the first and second magnetic tunnel junctions of the cell so as to detect which of the at least three logic states is stored by the cell.

9. The memory device of claim 8 wherein each memory element further comprises an access transistor connected between the interconnected junctions and the read bit line.

10. The memory device of claim 8 wherein the memory array is fabricated on a semiconductor substrate.

11. A memory device, comprising:
   a memory array including a plurality of memory elements, wherein each element comprises:
      a read bit line for the element;
      a first magnetic tunnel junction for the element;
      a second magnetic tunnel junction for the element; and
      a write bit line and a write data line associated with each of the first and second magnetic tunnel junctions and configured to control magnetic vector orientation with each of the first and second magnetic tunnel junctions so as to store information within the element in at least three logic states; and
   a sense amplifier coupled to the read bit line, the sense amplifier sensing combined resistance of the first and second magnetic tunnel junctions of the element so as to detect which of the at least three logic states is stored by the element.

12. The memory device of claim 11 wherein each memory element further comprises an access transistor connected between one of the first and second junctions and the read bit line.

13. The memory device of claim 11 wherein the memory array is fabricated on a semiconductor substrate.

14. A memory device, comprising:
   a memory array including a plurality of memory elements, wherein each element comprises:
      a first magnetic tunnel junction for the element;
      a second magnetic tunnel junction for the element connected to the first magnetic tunnel junction;
      an access transistor for the element which is connected between the first magnetic tunnel junction and a read bit line for the element; and
      a write bit line and a write data line associated with each of the first and second magnetic tunnel junctions; and
   a sense amplifier coupled to each read bit line, each sense amplifier sensing combined resistance of the first and second magnetic tunnel junctions of the element so as to detect which of at least three logic states has been stored by the element.

15. The memmy device of claim 14 wherein the first and second magnetic tunnel junctions are connected to each other in series and the access transistor is connected to a first end of the series connected magnet tunnel junctions.

16. The memory device of claim 14 wherein the memory array is fabricated on a semiconductor substrate.

* * * * *

UNITED STATES PATENT AND TRADEMARK OFFICE
CERTIFICATE OF CORRECTION

| | | |
|---|---|---|
| PATENT NO. | : 7,301,800 B2 | |
| APPLICATION NO. | : 10/881746 | |
| DATED | : November 27, 2007 | |
| INVENTOR(S) | : Christophe Frey | |

It is certified that error appears in the above-identified patent and that said Letters Patent is hereby corrected as shown below:

In the Claims:

At column 6, claim number 1, line number 27, please replace the phrase [within the element at least] with the phrase -- within the element in at least --.

At column 6, claim number 8, line number 67, please replace the word [resistence] with the word -- resistance --.

At column 8, claim number 15, line number 21, please replace the word [memmy] with the word -- memory --.

Signed and Sealed this
Thirteenth Day of September, 2011

David J. Kappos
*Director of the United States Patent and Trademark Office*